United States Patent
Ram et al.

(10) Patent No.: US 11,756,983 B2
(45) Date of Patent: Sep. 12, 2023

(54) SILICON NANO LIGHT EMITTING DIODES

(71) Applicant: Massachusetts Institute of Technology, Cambridge, MA (US)

(72) Inventors: Rajeev J. Ram, Arlington, MA (US); Jaehwan Kim, Cambridge, MA (US); Jin Xue, Cambridge, MA (US); Zheng Li, Shenzhen (CN)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/765,361

(22) PCT Filed: Dec. 10, 2021

(86) PCT No.: PCT/US2021/062889
§ 371 (c)(1),
(2) Date: Mar. 30, 2022

(87) PCT Pub. No.: WO2022/125950
PCT Pub. Date: Jun. 16, 2022

(65) Prior Publication Data
US 2023/0139185 A1    May 4, 2023

Related U.S. Application Data

(60) Provisional application No. 63/123,565, filed on Dec. 10, 2020.

(51) Int. Cl.
*H01L 27/15* (2006.01)
(52) U.S. Cl.
CPC ................... *H01L 27/156* (2013.01)

(58) Field of Classification Search
None
See application file for complete search history.

(56) References Cited

U.S. PATENT DOCUMENTS

| 7,453,097 B2 * | 11/2008 | Jin ..................... H01L 33/24 257/E51.026 |
| 8,436,333 B2 | 5/2013 | Saito et al. |
| 8,471,270 B2 * | 6/2013 | Bratkovski ......... H01L 33/0012 257/86 |
| 2009/0001498 A1 * | 1/2009 | Wang ................ H01L 31/03529 257/461 |
| 2011/0207255 A1 | 8/2011 | Sakakura et al. |
| 2015/0243712 A1 | 8/2015 | Wang et al. |
| 2015/0249230 A1 | 9/2015 | Kido |

(Continued)

OTHER PUBLICATIONS

Agarwal et al., "Optocoupling in CMOS." 2018 IEEE International Electron Devices Meeting (IEDM). IEEE, 2018. 4 pages.

(Continued)

*Primary Examiner* — Robert K Carpenter
(74) *Attorney, Agent, or Firm* — Smith Baluch LLP

(57) ABSTRACT

Light-emitting diodes having radiative recombination regions with deep sub-micron dimensions are described. The LEDs can be fabricated from indirect bandgap semiconductors and operated under forward bias conditions to produce intense light output from the indirect bandgap material. The light output per unit emission area can be over 500 W cm$^{-2}$, exceeding the performance of even high brightness gallium nitride LEDs.

20 Claims, 6 Drawing Sheets

(56) References Cited

U.S. PATENT DOCUMENTS

2016/0218158 A1 7/2016 Li et al.
2016/0240580 A1* 8/2016 Xianyu ............. H01L 27/14647
2019/0081112 A1 3/2019 Tsukamoto et al.

OTHER PUBLICATIONS

Dutta et al., "Opto-electronic modeling of light emission from avalanche-mode silicon p+ n junctions." Journal of applied physics 118.11 (2015): 114506. 11 pages.
Green et al., "Efficient silicon light-emitting diodes." Nature 412. 6849 (2001): 805-808.
Green et al., "Ultrathin (< 4 nm) $SiO_2$ and Si—O—N gate dielectric layers for silicon microelectronics: Understanding the processing, structure, and physical and electrical limits." Journal of Applied Physics 90.5 (2001): 2057-2121.
International Search Report in PCT/US2021/062889 dated Feb. 25, 2022 14 pages.
Saito et al., "Electro-luminescence from ultra-thin silicon " Japanese journal of applied physics 45.7L (2006): L679. 5 pages.
Saito et al., "Observation of optical gain in ultra-thin silicon resonant cavity light-emitting diode." 2008 IEEE International Electron Devices Meeting. IEEE, 2008. 4 pages.
Saito et al., "Silicon light-emitting transistor for on-chip optical interconnection." Applied Physics Letters 89.16 (2006): 163504. 4 pages.
Saito et al., "Stimulated emission of near-infrared radiation by current injection into silicon (100) quantum well." Applied Physics Letters 95.24 (2009): 241101. 4 pages.
Saito et al., "Stimulated emission of near-infrared radiation in silicon fin light-emitting diode." Applied Physics Letters 98.26 (2011): 261104. 4 pages.
Xue A small, bright silicon light-emitting diode directly integrated with microelectronics. Diss. Massachusetts Institute of Technology, 2021.

* cited by examiner

SILICON NANO LIGHT EMITTING DIODES

CROSS-REFERENCE TO RELATED APPLICATION

The present application is a national stage commencement under 35 U.S.C. § 371 of international application PCT/US2021/062889 filed Dec. 10, 2021, titled "Silicon Nano Light Emitting Diodes," which claims a priority benefit, under 35 U.S.C. § 119(e), to U.S. provisional application Ser. No. 63/123,565 filed on Dec. 10, 2020, titled "Silicon Nano Light Emitting Diodes," each of the foregoing applications is incorporated herein by reference in its entirety.

BACKGROUND

Silicon complementary metal-oxide-semiconductor (CMOS) has been adapted and established as a commercial microfabrication process to make integrated devices having optical functions such as waveguiding, photodetection, and optical modulation. Silicon is the predominant material chosen for such devices. However, the indirect bandgap of silicon has so far limited its use as a CMOS optical source suitable for communication and sensing applications.

There have been examples of silicon photonic systems in CMOS that realize integrated light sources by exploiting hot carrier electroluminescence associated with avalanche multiplication. These avalanche-mode light-emitting diodes (LEDs) provide broadband optical emission but exhibit relatively low internal quantum efficiency. They also require high reverse voltages (e.g., 5-17 volts), which is not favorable for today's low-voltage circuits and high modulation speeds.

Emission at significantly higher quantum efficiencies and lower operating voltages has been achieved using forward-biased silicon solar photovoltaic cells (peak external quantum efficiency as high as 0.55% in a 20 mm×20 mm vertical solar cell biased at only 0.7 V and operating at room temperature near 300 K). Emission under forward bias occurs by phonon-assisted inter-band recombination and results in light emission near the silicon bandgap ($\lambda$=1090 nm). However, this remarkably high conversion efficiency for an indirect semiconductor was achieved at relatively low light output flux (only 0.3 mW/cm$^2$) requiring a large device to obtain sufficient power. Several attempts to reproduce this performance of low-voltage LEDs in CMOS have yielded similarly low intensity light emission. Some of these attempts include reducing at least one dimension of an LED's recombination region below the Bohr radius for the exciton in silicon to engineer the energy bands of silicon and essentially convert the silicon band structure from an indirect bandgap to a quasi-direct bandgap along at least one dimension. By using such quantum confinement, carriers can recombine to produce a photon without the need for a phonon to carry away momentum from the recombination. However, emission from these quantum confinement devices is still very low (on the order of microwatts/cm$^2$).

SUMMARY

Semiconductor light sources having a radiative recombination region with deep sub-micron and nano-scale dimensions are described. The radiative recombination region in the light sources can be fabricated from indirect bandgap semiconductor material and the light sources can be operated under forward bias conditions. Surfaces around the radiative recombination region can be passivated with quality passivation layers to reduce non-radiative recombination in the light sources. The light output per unit area is orders of magnitude larger than light output from other LEDs fabricated from the same semiconductor material.

Some implementations relate to a structure comprising indirect bandgap semiconductor material formed on a substrate. The structure can have a maximum dimension that is no larger than 1000 nm and a minimum dimension that is no smaller than 25 nm. The structure can include a semiconductor junction and a radiative recombination region formed from the indirect bandgap semiconductor material, a first region of n-type semiconductor material connected to the structure and arranged to inject electrons into the radiative recombination region in a first direction, and a second region of p-type semiconductor material connected to the structure and arranged to inject holes into the radiative recombination region in a second direction such that the electrons and the holes recombine in the radiative recombination region to produce photons.

Some implementations relate to a method of making a light source. The method can include acts of: forming a structure from indirect bandgap semiconductor material on a substrate to include a semiconductor junction and a radiative recombination region, wherein the structure has a maximum dimension no larger than 1000 nm and a minimum dimension no smaller than 25 nm; forming a first region of n-type semiconductor material to inject electrons into the radiative recombination region in a first direction; and forming a second region of p-type semiconductor material to inject holes into the radiative recombination region in a second direction such that the electrons and the holes recombine in the radiative recombination region to produce photons.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 4A:
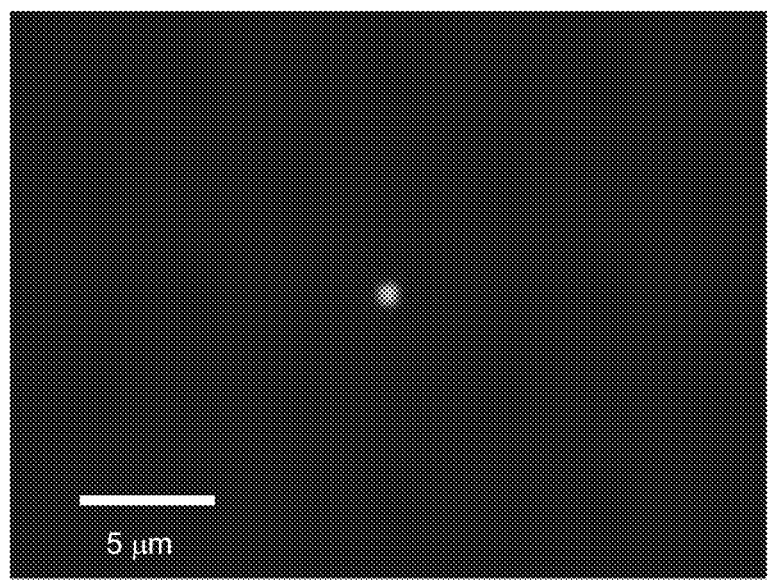
FIG. 4A is an image of an emission pattern from a nanowire LED.
Figure 4B:
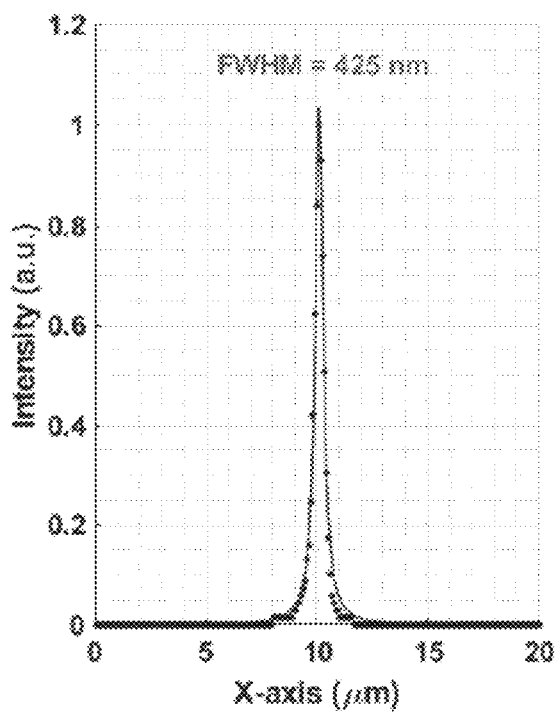

FIG. 4B plots an emission beam profile (measured along an x axis) for the nanowire LED of FIG. 4A.

Figure 4C:
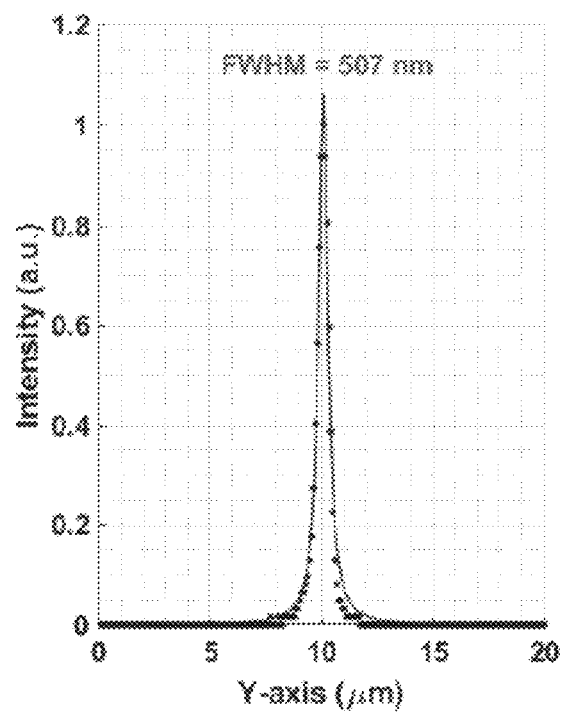

FIG. 4C plots an emission beam profile (measured along any axis) for the nanowire LED of FIG. 4A.

Figure 5:
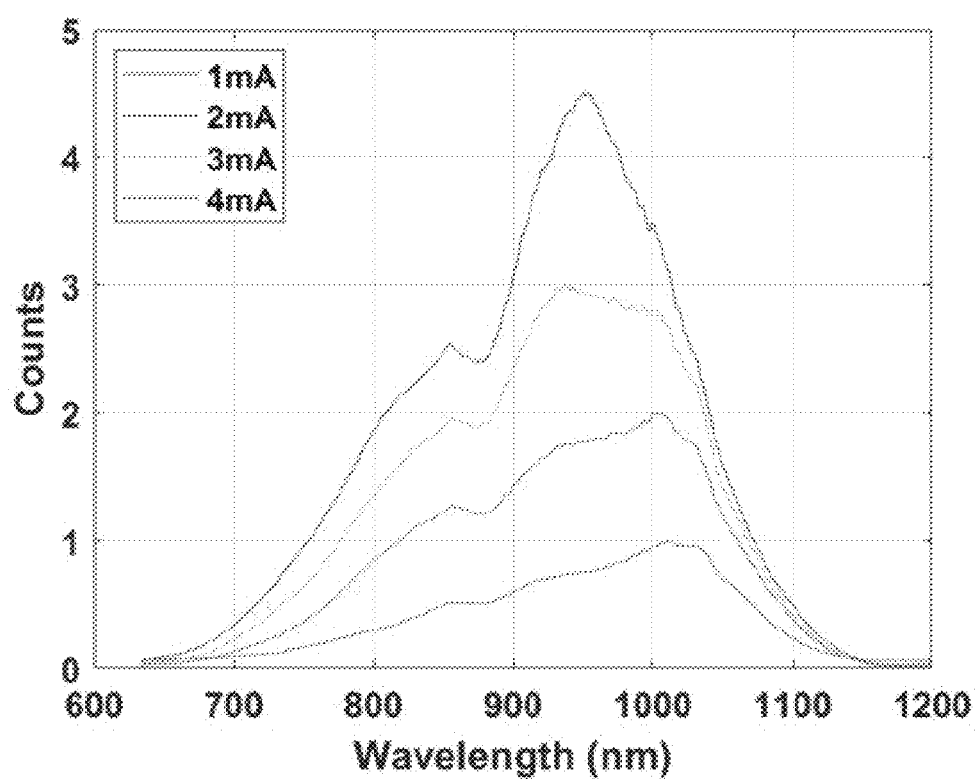

FIG. 5 plots measured spectral emissions from the nanowire LED of FIG. 4A at different current levels.

Figure 6:
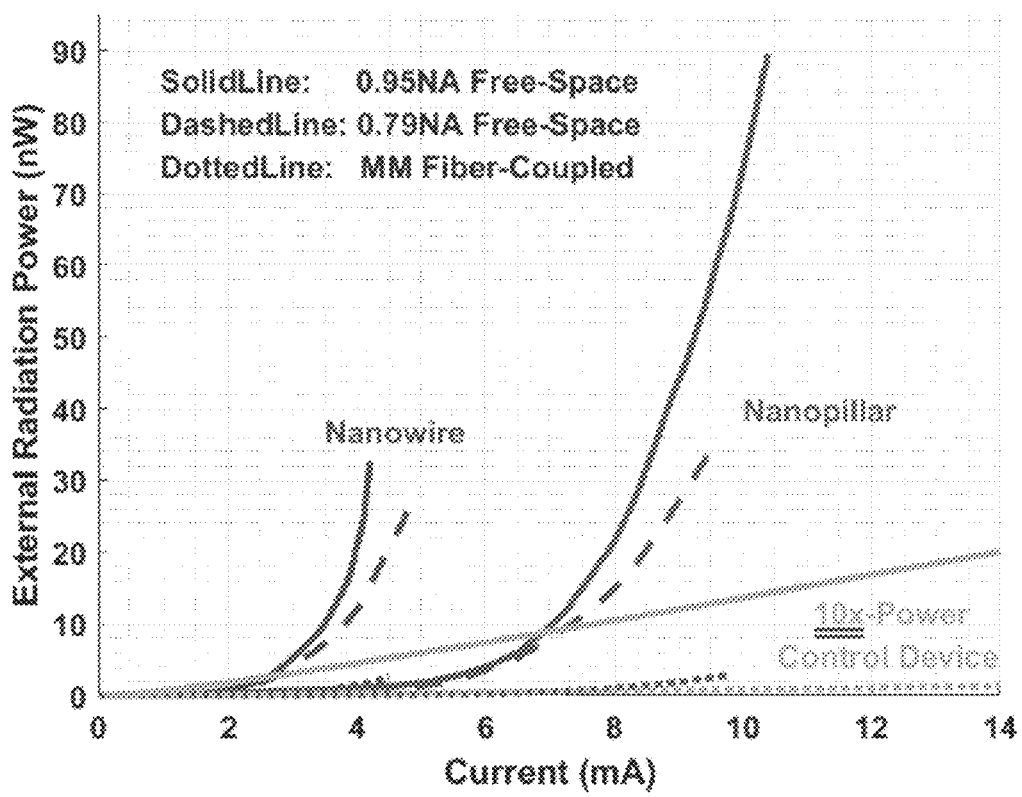

FIG. 6 plots power outputs measured from a nanowire LED, a nanopillar LED, and a control device.

Figure 7:
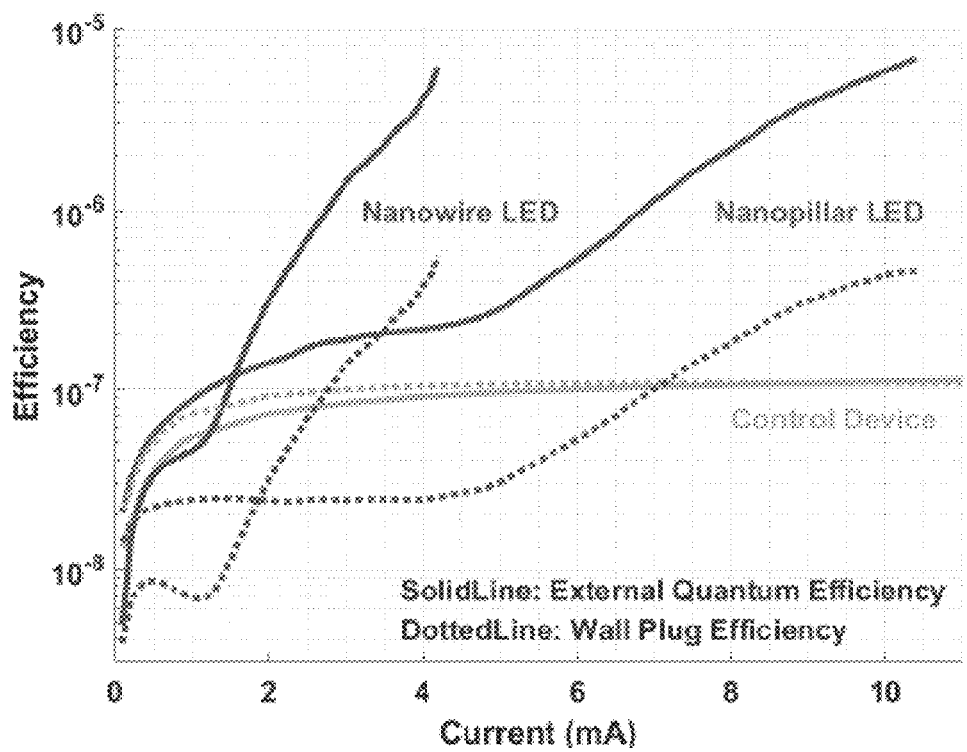

FIG. 7 plots external quantum efficiency and wall plug efficiency for a nanowire LED, a nanopillar LED, and a control device.

DETAILED DESCRIPTION

Silicon technologies continue to advance and improve for both electronics and photonics. For decades, the pursuit of all-silicon electronic and photonic integration has been hindered by the lack of a native silicon light source due to silicon's indirect bandgap energy band structure. Considerable effort has been expended to achieve light generation from silicon by altering material structure or composition, but a useful device with practical output intensity for commercial manufacture and use has not be achieved by researchers.

A silicon light emitter would be highly useful for silicon photonics applications (e.g., as an optical source for a transceiver in an optical communication network). The light emitter, detector, and driving electronics could all be formed from silicon and therefore readily integrated onto a same chip. The inventors have recognized and appreciated that a silicon light emitter with adequate efficiency and optical output can be even more useful if its fabrication can be carried out with a current, unmodified CMOS process. With such an emitter, the emitter, detector, and signal driving and processing electronics could all be fabricated on a same chip using a conventional CMOS process.

The current approach to communication systems that include silicon photonics is to use light sources fabricated from other materials (typically III-V semiconductor materials such as indium gallium nitride or indium phosphide, to name but a few). These light sources must be fabricated using a non-CMOS process and then later aligned and coupled to a silicon photonic integrated circuit. As such, the light sources can add considerable cost to a photonic circuit that would more desirably be made using only a CMOS process.

Although a number of attempts have been made since the 1990's to develop silicon light emitters, a practical device for use in commercial applications has not yet been demonstrated. The inventors have recognized and appreciated that a practical silicon light emitter should preferably be formed using a CMOS process, be small in size (e.g., a footprint less than 100 square microns), have adequate output intensity to communicate over an optical data link (e.g., comprising optical fiber) having a length from one meter to two kilometers or that can accommodate 30 dB of optical loss for on-board or on-chip communications, and have an output mode that can efficiently couple to a single-mode optical fiber or waveguide. Shorter or longer optical communication links may also be possible with the light sources described herein. The inventors have further recognized and appreciated that a silicon emitter may have an advantage over III-V semiconductor emitters for small device sizes where the radiative recombination region of the emitter has a maximum dimension of one micron or less. The advantage of silicon relates to its considerably lower bulk Shockley-Read-Hall (SRH) non-radiative recombination rate coefficient ($10^4$-$10^5$ s$^{-1}$) compared to that of III-V semiconductors ($10^7$-$10^8$ s$^{-1}$). Because the III-V emitters have a much higher quantum yield than silicon, they have been deployed successfully for larger device sizes (100 microns or more). However, as device sizes shrink below 100 microns, non-radiative recombination of carriers at the surface of the device's radiative recombination region begins to dominate total non-radiative recombination (due to a higher surface to volume ratio of the radiative recombination region) and device efficiency suffers. Further, as device size drops below about 5 microns, it becomes increasingly difficult to inject carriers efficiently into the radiative recombination region.

The inventors have recognized and appreciated that silicon has an advantageously lower SRH non-radiative recombination rate and that effects of surface non-radiative recombination do not catch up with the bulk rate until the device size is below 1 micron. The inventors have also recognized and appreciated that surface passivation layers can mitigate non-radiative recombination at the surfaces of the active region to improve device efficiency. As such, silicon devices having a maximum dimension in the radiative recombination region in a range from about 25 nm to about 1000 nm may compete with or even outperform other indirect bandgap devices and even III-V light emitting devices having a same size and based on direct bandgap semiconductor material.

There are two general approaches that the inventors have considered for fabricating light emitting diodes from silicon. One approach is to fabricate so-called vertical junction LEDs. A vertical junction LED has an interface between n-type and p-type layers that are stacked one above the other on a substrate and extend laterally in two dimensions and parallel to the surface of the substrate upon which the LED is fabricated. For example, a p-type layer may be formed over an n-type layer on a substrate to form the vertical junction LED. As such, the LED's radiative recombination region and optical emission area also extend predominantly laterally and parallel to the surface of the substrate. Several efforts to demonstrate silicon emitters have used vertical junction LEDs.

A desirable feature of a vertical junction LED is that the diode's junction and radiative recombination region can be located below the surface of the semiconductor in which the junction is fabricated, mitigating undesirable effects of surface non-radiative recombination. Also, the diode's optical emission area can be patterned in any desired shape with high precision using conventional microfabrication tools and processes, such as a complementary metal-oxide-semiconductor (CMOS) process. However, the inventors have recognized and appreciated that there are several drawbacks encountered when scaling vertical junction LEDs to sub-micron sizes. A first drawback is that a guard ring formed between the device's anode and cathode cannot be included at small device size due to feature-size limitations associated with the CMOS microfabrication process. The omission of the guard ring has a deleterious affect on device efficiency since the guard ring mitigates non-radiative recombination of carriers in the device. A second drawback relates to one of the metal contacts (anode or cathode) that must be placed over the optical emission area to electrically connect to the p-type or n-type region of the LED. Due to electromigration constraints, the contact size must remain above a certain size to provide enough current to drive the LED and produce an adequate amount of light output. The metal contact then occupies and blocks an increasingly larger portion of the optical emission area as the LED is scaled to smaller sizes.

Figure 1A:
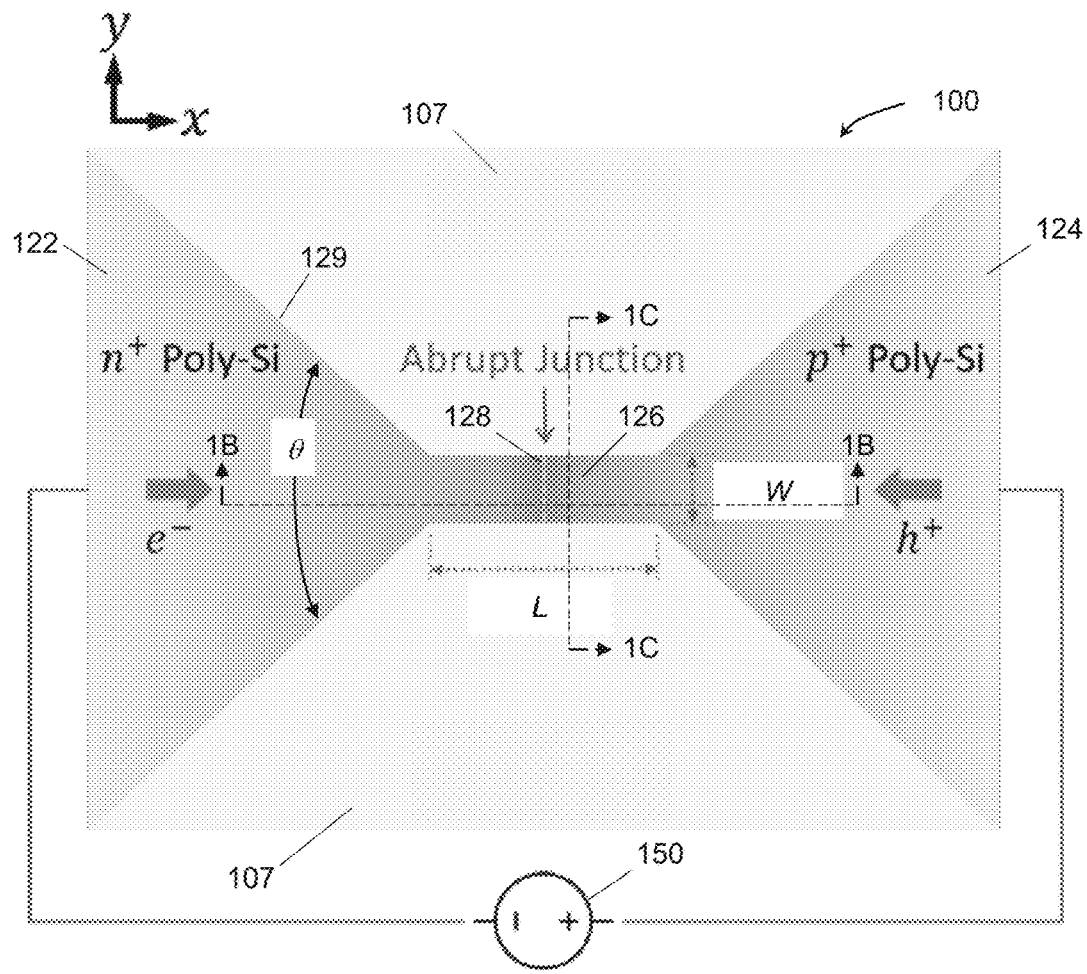
FIG. 1A depicts, in plan view, an example of a nanowire LED light source having a radiative recombination region with deep sub-micron dimensions and comprising an indirect bandgap semiconductor material.
Figure 1B:
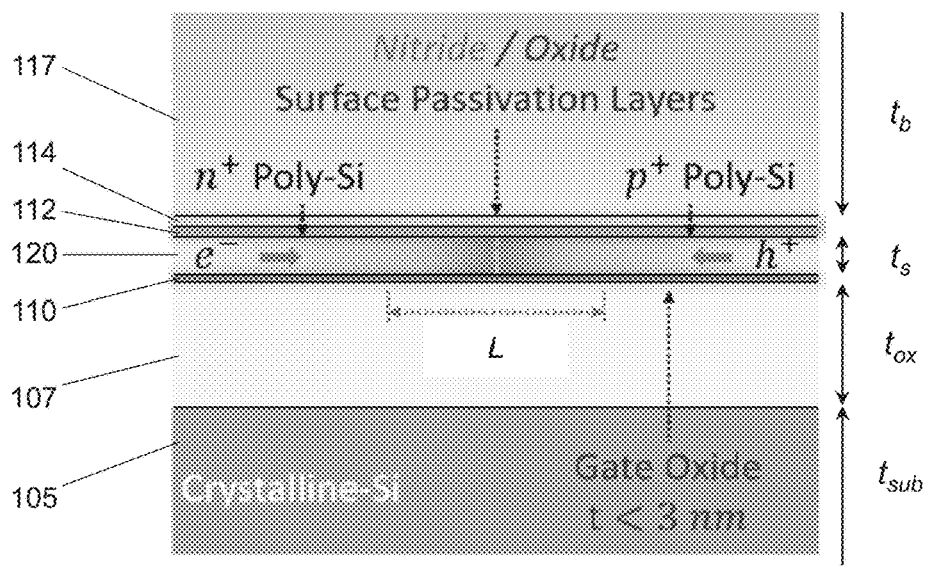
FIG. 1B depicts, in elevation side view, a portion of the light source of FIG. 1A.
Figure 1C:
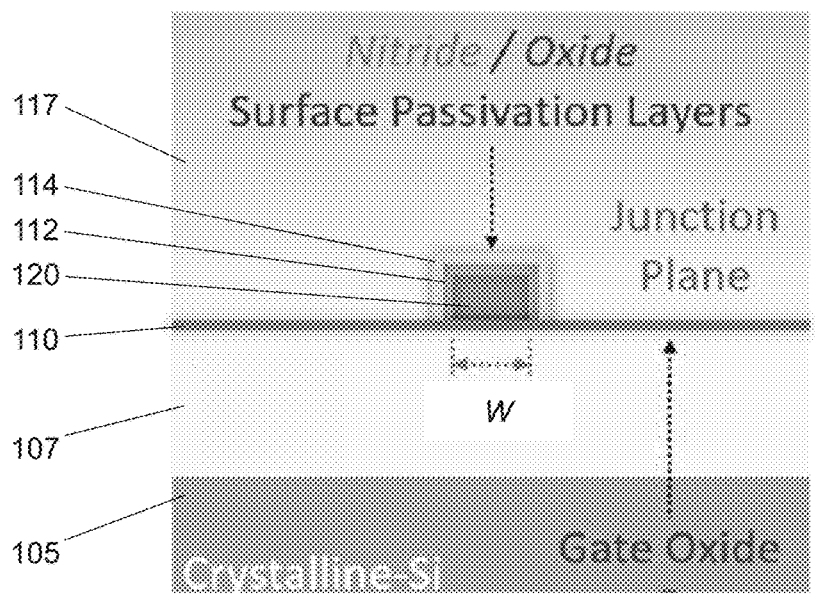
FIG. 1C depicts, in elevation end view, a portion of the light source of FIG. 1A.
Figure 2A:
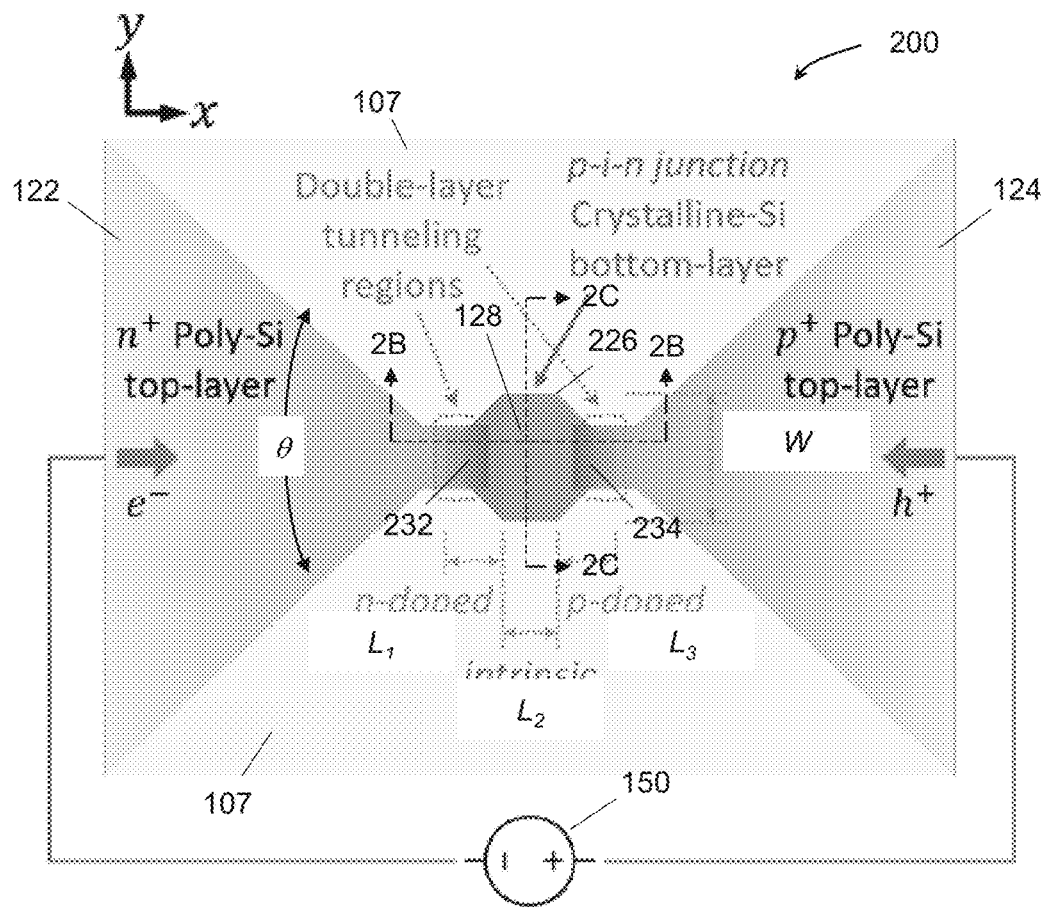
FIG. 2A depicts, in plan view, an example of a nanopillar LED light source having a radiative recombination region in a sub-micron sized pillar and comprising an indirect bandgap semiconductor material.
Figure 2B:
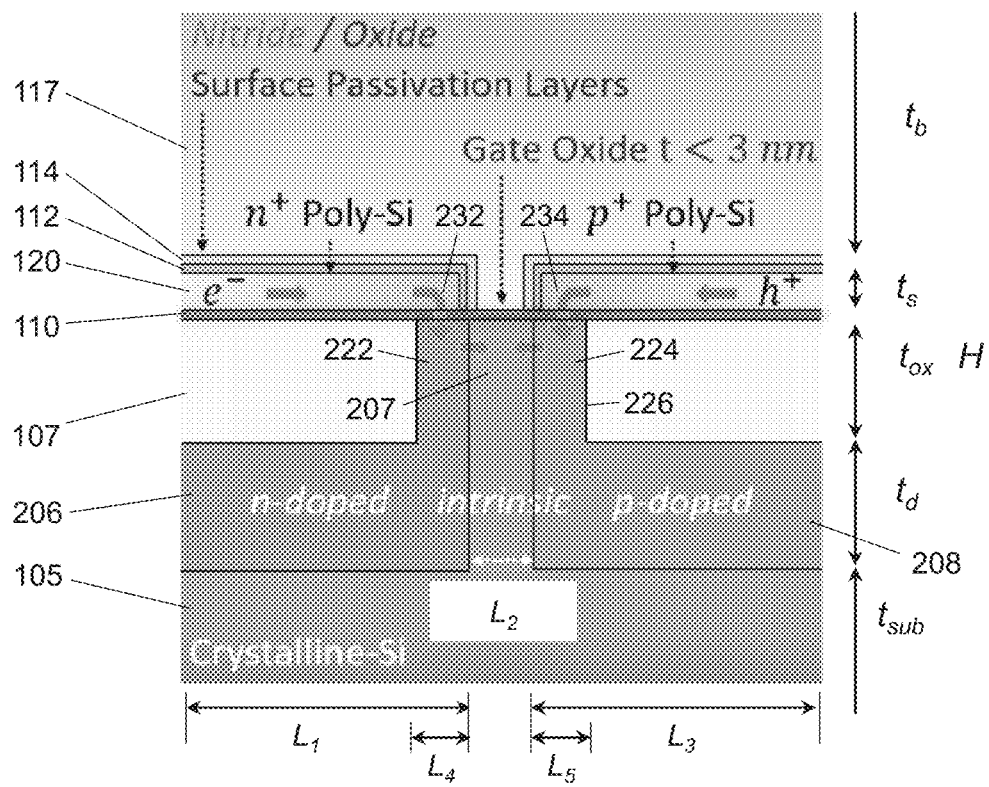
FIG. 2B depicts, in elevation side view, a portion of the light source of FIG. 2A.
Figure 2C:
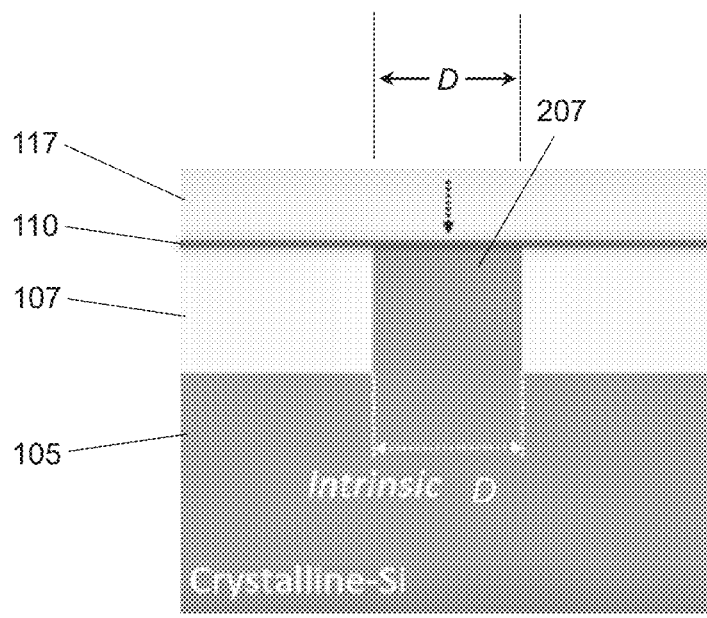
FIG. 2C depicts, in elevation end view, a portion of the light source of FIG. 2A.

Another approach to fabricating light-emitting diodes is to make so-called lateral junction LEDs. FIG. 1A through FIG. 1C depict one example of a lateral junction nanowire LED 100 that is formed from an indirect bandgap semiconductor (silicon for the illustrated example). FIG. 2A through FIG. 2C depicts another example of a lateral junction nanopillar LED 200 that is formed from an indirect bandgap semiconductor. Neither device utilizes quantum confinement or band engineering to convert the indirect bandgap semiconductor material to a quasi-direct bandgap semiconductor material to obtain improved optical emission from the LEDs. Neither device has a radiative recombination region dimension less than 10 nm that could cause quantum confinement of carriers and/or band engineering. The nanowire LED 100 is capable of outputting over 500 W/cm$^2$ from its radiative recombination region of indirect bandgap material, which surpasses even current state-of-the-art, direct bandgap, gallium-nitride LEDs.

FIG. 1A depicts, in plan view, an example of a nanowire LED 100 having a radiative recombination region with deep sub-micron dimensions. The LED 100 can be formed from an indirect bandgap semiconductor material such as silicon, germanium, an alloy of silicon-germanium, or gallium-phosphide. For the example embodiment, the nanowire LED 100 is formed from a single layer 120 of silicon (see the elevation view of FIG. 1B). The LED comprises a tapered n-type injector 122, a tapered p-type injector 124, and a nanowire 126 located between the two injectors. A semiconductor junction 128 is formed along the nanowire between n-type and p-type regions of the semiconductor layer 120. Carriers injected from each injector travel along the nanowire 126 and recombine to produce photons. FIG. 1C is an end-on elevation view of the nanowire 126 taken at the cross-sectional line indicated in FIG. 1A.

The radiative recombination region is a region in the vicinity of the junction 128 from which peak photon emission occurs and includes more than one-half of the emitted photons. The size of the radiative recombination region can be constrained, at least in part, by the physical dimensions of the semiconductor material in which the junction is formed (such as the dimensions of the nanowire 126). The size of the recombination region can also be constrained in other ways (e.g., by including potential barriers to the carriers, as described below for the nanopillar LED 200). Non-radiative recombination can also occur in the radiative recombination region.

Referring to FIG. 1B, the semiconductor layer 120 can be formed on or above a substrate 105. The substrate 105 can be, but is not limited to, a bulk semiconductor substrate and can have a thickness $t_{sub}$ in a range from 10 microns to 2 millimeters. However, thinner or thicker substrates can also be used. For the illustrated example, the substrate has a thickness $t_{sub}$ of approximately 800 microns. Other types of materials may be used for the substrate 105, such as quartz, fused silica, sapphire, a ceramic, a glass, a polymer, or a metal. In some cases, a semiconductor layer may be deposited on a non-semiconductor substrate and be used to fabricate a nanowire LED 100.

The substrate 105 can have one or more layers formed thereon that underlie the nanowire LED 100. For the illustrated example, an oxide 107 having a thickness $t_{ox}$ is formed on the substrate 105. The oxide 107 can be formed by a wet oxide process or by a dry process, such as a chemical vapor deposition (CVD) process. In some cases, the oxide 107 is a trench oxide formed using a standard CMOS shallow trench insulator process. The thickness $t_{ox}$ can have a value in a range from approximately or exactly 50 nm to approximately or exactly 5 microns. In some implementations, instead of depositing an oxide 107 on the substrate, and later depositing the semiconductor layer 120, a silicon-on-insulator (SOI) wafer can be used provided the insulator layer has adequate passivation properties (e.g., yields an effective surface recombination velocity that is less than 10 cm/s).

When referring to a layer or device being formed on a substrate, the word "on" is used to include forming the layer on, above, or up to 50 microns into a process side of the substrate 105. The process side of the substrate is the side on which devices are fabricated. Since the substrate thickness is typically much greater than the thickness of layers and devices formed on the process side of the substrate and etch depths into the substrate, then all layers and devices are essentially formed on the substrate, even if formed in an etched depression into a process side of the substrate.

To mitigate non-radiative recombination in the nanowire LED 100, one or more quality passivating layers can be formed on at least three sides of the nanowire 126 and its radiative recombination region. One example of a quality passivating layer is a quality gate oxide 110 that can be formed by current CMOS processes, such as a lamp heated rapid thermal oxidation (RTO) process or atomic layer deposition (ALD) process. The gate oxide 110 can be deposited on the oxide 107 and have improved passivation properties over a trench oxide, for example. For example, the gate oxide 110 may terminate more dangling bonds of the adjacent silicon compared to the oxide 107 and thereby remove the dangling bonds as potential defects and traps from the radiative recombination region. The thickness of the gate oxide 110 can be in a range from approximately or exactly 2 nm to approximately or exactly 10 nm. In some cases, the thickness of a passivating layer can have a value in a range from approximately or exactly 0.5 nm to approximately or exactly 5 nm. In an example nanowire LED fabricated according to the design of FIG. 1A, the thickness of the gate oxide was about 3 nm.

Other types of passivating layers can be used instead of or in addition to the gate oxide 110. The passivating layer can be a single layer of material, or it can be a stack of two or more layers of different materials. Materials that can be used for the passivating layer(s) include, but are not limited to, silicon oxide, silicon nitride, silicon oxynitride, hafnium dioxide, zirconium dioxide, and titanium dioxide.

The deposition of the passivating layers described herein can include a plurality of microfabrication steps. Such steps can include an initial surface preparation of the process side of the wafer and material on which the passivation layer will be deposited. Surface preparation can include polishing and cleaning techniques to smooth the surface on which the passivation layer will be deposited and to remove contaminants from the surface. For example, a chemical-mechanical polishing (CMP) step can be carried out to smooth the surface following by wet and/or dry cleaning processes. An example wet cleaning process that can be used is the RCA chemical cleaning process used widely in the semiconductor industries. An example dry cleaning is a UV/Cl$_2$ plasma treatment. Following surface preparation, the passivating layer(s) can be deposited by techniques described herein. These and other techniques can include thermal growth (e.g., thermal oxidation (wet or dry), thermal oxynitridation, etc.), chemical deposition (e.g., chemical vapor deposition, atomic layer deposition, jet vapor deposition, etc.) and/or physical deposition (e.g., ion implantation, plasma immersion implantation, etc.). Generally, thermal oxidation or oxynitridation can provide higher quality passivation layers though can require higher temperatures during deposition. After deposition, post-deposition processing can be carried out to improve the quality of the deposited passivation layer(s). Such post-deposition processing can include annealing the passivation layer(s). In some cases, the post-processing annealing can be carried out in a deuterium environment to replace hydrogen atoms in the passivating layer(s) with deuterium atoms, which can improve the electrical properties of the passivation layer(s).

The semiconductor layer 120 can be formed on the gate oxide 110. In some cases, an additional passivating layer (such as a nitride) may be formed between the gate oxide 110 and the semiconductor layer 120. The semiconductor layer 120 can have a thickness $t_s$ in a range from approximately or exactly 50 nanometers (nm) to approximately or exactly 1000 nm. In some cases, the thickness $t_s$ may be as small as 25 nm or as small as 10 nm without affecting the band structure of the semiconductor layer 120 (such as silicon) in the nanowire, so that the semiconductor layer remains an indirect bandgap semiconductor where carriers recombine to produce light. The semiconductor layer 120 may be formed from any indirect bandgap semiconductor or compound semiconductor. The semiconductor layer 120 can be crystalline, polycrystalline, or an amorphous semiconductor. The semiconductor layer 120 can have a uniform thickness $t_s$ throughout at least the nanowire 126. The thickness of the tapered injectors 122, 124 can be the same or different from the thickness $t_s$ of the nanowire 120. For the example fabricated nanowire LED, the thickness of the polysilicon semiconductor layer was about 100 nm and uniform throughout the injectors 122, 124 and nanowire 126.

After the semiconductor layer 120 is patterned to form the injectors 122, 124 and nanowire 126 (e.g., using photolithographic and standard CMOS etching processes), quality passivating layers can be formed on side and top surfaces of the injectors 122, 124 and the nanowire 126. Although the injectors 122, 124 are depicted as opposing each other in FIG. 1A (carriers injected along two opposing directions that are 180 degrees with respect to each other), they need not be. In some implementations, the injectors 122, 124 may be oriented at another angle with respect to each other. For example, an angle between central axes of the injectors can be a value from 30 degrees to 180 degrees, such that carriers can be injected to the active region of the nanowire along directions having an angle between them from 30 degrees to 180 degrees. According to some implementations, a native oxide 112 is formed on the sides and top surfaces of the injectors and nanowire. The native oxide may be up to 20 nm thick. A nitride layer 114 (such as silicon nitride) can then be deposited over the native oxide 112 to further passivate the surfaces. A thickness of the nitride can be in a range from 2 nm to 50 nm. In some cases, a passivating oxide and/or nitride can be formed using a conformal deposition process such as an ALD process. For the example fabricated nanowire LED, the thickness of the native oxide 112 was about 6 nm and the thickness of the silicon nitride layer 114 was about 24 nm. The native oxide 112 and nitride layer 114 can be formed by a thermal process with surface preparation before deposition and post-deposition processing as described above.

Subsequently, there can be back end of line (BEOL) layers 117 formed over the nanowire LED 100. The BEOL layers 117 can include metallization layers that have been patterned to connect to the injectors 122, 124 and to form pads for connecting to a current source or voltage source 150, which may be located off chip or on chip. The BEOL layers can also include dielectric layers. The total thickness $t_b$ of the BEOL layers can depend on the number of devices and complexity of a circuit formed on the substrate and can be in a range from 2 microns to 20 microns or more.

The nanowire 126 can have a length L and width W. The width W of the nanowire 126 can be in a range from approximately or exactly 50 nm to approximately or exactly 1000 nm. In some cases, the width W may be as small as 25 nm or as small as 10 nm without affecting the band structure of the semiconductor layer 120 in the nanowire, so that the semiconductor layer remains an indirect bandgap semiconductor where carriers recombine to produce light. The length L of the nanowire 126 can be in a range from approximately or exactly 50 nm to approximately or exactly 1000 nm. In some cases, the length L may be as small as 25 nm or as small as 10 nm without affecting the band structure of the semiconductor layer 120 in the nanowire, so that the semiconductor layer remains an indirect bandgap semiconductor where carriers recombine to produce light. For the example fabricated nanowire LED, the width W of the nanowire 126 was about 55 nm and the length L of the nanowire was about 117 nm. The junction 128 was located half-way along the nanowire 126.

The n-type injector 122 and a first portion of the nanowire 126 may be doped to have n-type conductivity. The doping density for a donor dopant can be in a range from approximately or exactly $1 \times 10^{16}$ cm$^{-3}$ to approximately or exactly $5 \times 10^{20}$ cm$^{-3}$. The p-type injector 124 and a second portion of the nanowire 126 may be doped to have p-type conductivity. The doping density for an acceptor dopant can be in a range from approximately or exactly $1 \times 10^{16}$ cm$^{-3}$ to approximately or exactly $5 \times 10^{20}$ cm$^{-3}$. The dopant concentrations can be uniform on each side of the junction 128 up to the junction, though the dopant concentrations can be graded in some cases. In some implementations, there may be a region of undoped or intrinsic semiconductor at and in the vicinity of the junction 128 to form a p-i-n LED. The intrinsic region may have any length along the nanowire 126. In some cases, the entire length of the nanowire 126 may be intrinsic. In the example fabricated nanowire LED, the dopant density was about $1 \times 10^{20}$ cm$^{-3}$ in the n-type and p-type regions.

The n-type injector 122 and p-type injector 124 can taper laterally at any angle θ in a range from approximately or exactly 5 degrees to approximately or exactly 150 degrees, so as to concentrate carries into the nanowire 126. Although the tapered injectors have straight sidewalls 129 in FIG. 1A, the sidewalls 129 may curve in some implementations so that there is not an abrupt angle at the junction of the injectors 122, 124 and nanowire 126. In some cases, sidewalls of the nanowire 126 may curve having a narrowest width W at the junction 128. For the example fabricated nanowire LED, the taper angles were about 90 degrees.

To improve efficiency of carrier injection into the LED's junction 128, the n-type injector 122 and p-type injector 124 can also be passivated on two or more sides with quality passivation layers that are described above. In the example implementation, a CMOS gate oxide 110 that is used to passivate a lower surface of the nanowire 126 also passivates lower surfaces of the injectors 122, 124, though other quality passivating layers (e.g., formed by ALD) may be used instead of the gate oxide for the injectors and the nanowire. Side and top surfaces of the injectors 122, 124 can be passivated with the same layer(s) used to passivate side and top surfaces of the nanowire 126.

As may be appreciated, fabrication of the nanowire LED 100 can be relatively straightforward. The oxide 107 can be formed on the process side of a planar substrate 105 (e.g., using a shallow trench isolation process). The surface of the oxide 107 can be polished using chemical-mechanical polishing (CMP), for example, to produce a smooth surface. A gate oxide 110 can then be deposited on the oxide 107, followed by deposition of the semiconductor layer 120. In some implementations, the semiconductor layer can be deposited by sputtering or a CVD process to produce polycrystalline semiconductor. The deposited semiconductor can then be polished smooth (e.g., using CMP) and patterned using current photolithographic and CMOS processes to form the injectors 122, 124 and nanowire 126. Passivation layers 112, 114 can then be formed over the patterned semiconductor layer 120. Doping of the semiconductor layer 120 can be performed in several steps by ion implantation using two lithographic masks that are each patterned over one injector and a portion of the nanowire in sequential steps. Ions are implanted into the injector and portion of the nanowire 126 that is not covered by a mask. Subsequently, BEOL layers can be formed over the device using standard CMOS processes.

FIG. 2A depicts, in plan view, an example of a nanopillar LED 200 comprising an indirect bandgap semiconductor material and having a radiative recombination region in a sub-micron sized pillar 226. FIG. 2B depicts a portion of the LED 200 of FIG. 2A in an elevation side view, taken at the cross-sectional line indicated in FIG. 2A. FIG. 2C depicts a portion of the LED 200 of FIG. 2A in an elevation end view, taken at the cross-sectional line indicated in FIG. 2A.

The nanopillar LED 200 also includes an n-type tapered injector 122 and a p-type tapered injector 124 that inject carriers into the LED's junction 128. Like the injectors of the nanowire LED 100, the injectors 122, 124 have a lateral taper angle $\theta$ that can be in a range from approximately or exactly 5 degrees to approximately or exactly 150 degrees. Surfaces of the injectors 122, 124 for the nanopillar LED 200 can be passivated with quality passivation layers as described above for the nanowire LED 100. For example, bottom surfaces of the injectors 122, 124 can be passivated with a quality CMOS gate oxide 110 and/or an ALD oxide or nitride. Side and top surfaces of the injectors 122, 124 can be passivated with a native oxide 112 and a nitride layer 114. Dopant densities and materials for the injectors 122, 124 can be the same as those described above for the nanowire LED 100.

The n-type tapered injector 122 and p-type tapered injector 124 can be formed from the semiconductor layer 120, as described above for the nanowire LED 100. The n-type tapered injector 122 and p-type tapered injector 124 can terminate on opposing sides of the pillar 226, without physically contacting each other. Carriers that are injected by each injector 122, 124 can travel down into the pillar 226, as depicted by the broad arrows in FIG. 2B.

The pillar 226 extends vertically from a surface of the substrate 105, as can be seen in FIG. 2B, and comprises a vertical n-type conductivity region 222, an intrinsic region 207 (which can be a portion of the undoped substrate 105), and a vertical p-type conductivity region 224. The vertical n-type conductivity region 222, intrinsic region 207, and vertical p-type conductivity region 224 can form a p-i-n junction in the pillar 226. In some cases, a nanopillar LED may not have an intrinsic region and instead comprise a p-n junction. A dopant density in the n-type region can be in a range from approximately or exactly $1\times10^{16}$ cm$^{-3}$ to approximately or exactly $1\times10^{20}$ cm$^{-3}$. A dopant density in the p-type region can be in a range from approximately or exactly $1\times10^{16}$ cm$^{-3}$ to approximately or exactly $1\times10^{20}$ cm$^{-3}$.

A height H of the pillar 226 can be essentially equal to a thickness $t_{ox}$ of the oxide 107 that surrounds the pillar 226. In some implementations, the process of forming the oxide 107 (e.g., patterning and etching a trench into the substrate 105 where the oxide 107 will be deposited or formed, filling the trench with oxide, and planarizing the wafer) defines the shape and height of the pillar 226. A height H of the pillar 226 can have a value in a range from approximately or exactly 50 nm to approximately or exactly 5 microns.

A diameter D of the pillar 226 can be in a range from approximately or exactly 25 nm to approximately or exactly 1000 nm. The vertical n-type conductivity region 22 can connect to an n-type conductivity region 206 that extends farther out and under a portion of the semiconductor layer 120 that forms the n-type tapered injector 122. A total length $L_1$ of the n-type conductivity region 206 can have a value in a range from approximately or exactly 50 nm to approximately or exactly 1000 nm. A length $L_4$ of the vertical n-type conductivity region 222 can have a value in a range from 20 nm to one-half the diameter D of the pillar 226, though in some cases $L_4$ could be as small as 10 nm. A maximum width of the n-type conductivity region 206 can have a value up to the diameter D of the pillar 226. The n-type conductivity region 206 can have a narrower width where it extends under the n-type tapered injector 122 than its width in the pillar 226. The vertical n-type conductivity region 222 can extend to the gate oxide 110 or underlying passivation layer of the semiconductor layer 120.

A length $L_2$ of the intrinsic region 207, when present, can have a value in a range from approximately or exactly 20 nm to approximately or exactly 200 nm. The intrinsic region 207 can comprise a portion of the substrate 105 that has not been doped nor etched. A top surface of the intrinsic region 207 can be passivated with a gate oxide 110 or other passivating layers 112, 114 described above.

The vertical p-type conductivity region 224 can connect to a p-type conductivity region 208 that extends farther out and under a portion of the semiconductor layer 120 that forms the p-type tapered injector 124. A total length $L_3$ of the p-type conductivity region 208 can have a value in a range from approximately or exactly 50 nm to approximately or exactly 1000 nm. A length $L_5$ of the vertical p-type conductivity region 224 can have a value in a range from 20 nm to one-half the diameter D of the pillar 226. A maximum width of the p-type conductivity region 208 can have a value up to the diameter D of the pillar 226. The p-type conductivity region 208 can have a narrower width where it extends under the p-type tapered injector 124 than its width in the pillar 226. The vertical p-type conductivity region 224 can extend to the gate oxide 110 or underlying passivation layer of the semiconductor layer 120.

In some implementations, the oxide 107 may extend all the way from the gate oxide 110 (or bottom passivation layer(s) of the semiconductor layer 120) to the substrate 105 and there may be no portions of the n-type conductivity region 206 nor p-type conductivity region 208 that extends under the oxide 107. In such cases, the doped vertical regions 222, 224 of the pillar 226 can extend from the gate oxide 110 or bottom passivation layer(s) to the substrate 105.

The nanopillar LED 200 can have an n-side tunneling region 232 and a p-side tunneling region 234 where carriers from each injector tunnel through an oxide barrier (e.g., the gate oxide 110) into the pillar 226 where the carriers recombine to produce photons. The barrier produced by the gate oxide 110 can help confine carriers in the LED's radiative recombination region after they have tunneled through the barrier and help prevent leakage of carriers back into the semiconductor layer where they could otherwise undergo non-radiative recombination. As such the gate oxide 110 can provide two functions: carrier confinement in the radiative recombination region and passivation to reduce nonradiative recombination in the radiative recombination region. Oxide barriers may be used for the nanowire LED 100 also (e.g., by separating the injectors 122, 124 and forming the recombination region in a second semiconductor layer that overlaps the injectors and is separated from the injectors by a second gate oxide layer).

Fabrication of the nanopillar LED 200 can use similar CMOS processing steps and a similar method as described above for the nanowire LED 100. For example, the substrate 105 can be a semiconductor substrate (e.g., a bulk silicon substrate) that is doped at the beginning of the fabrication process to form n-type conductivity region 206 and p-type conductivity region 208. The doping can be carried out using ion implantation and masks to block ions from regions of the substrate that are not doped. Two steps of mask patterning and ion implantation can be performed to produce the n-type conductivity region 206 and p-type conductivity region 208.

Another mask can then be patterned on the substrate to define the pillar 226 (blocked by the mask) and trench (open area) which will be etched (e.g., by reactive ion etching). The etching into the doped regions defines the pillar 226 and the vertical n-type conductivity region 222 and vertical p-type conductivity region 224. The oxide 107 can be deposited in the etched trench to fill the trench, and the wafer can be planarized to smooth the top surface of the oxide 107 and expose the top of the pillar 226. The subsequent layers of gate oxide 110, semiconductor layer 120, passivation layers 112, 114, and BEOL layers 117 can be formed on the substrate as described above. The semiconductor layer 120 can be patterned using photolithography and etching to open an area above the pillar before applying passivation layers 112, 114. In some cases, the passivation layers 112, 114 can extend across the top of the pillar 226 on the gate oxide 110, which may not be removed from the top of the pillar 226.

As may be appreciated, the recombination and photon emission regions of the nanowire LED 100 and nanopillar LED 200 can be smaller than the wavelength of emission from the LED. For example, when silicon is used for the LED's active region, the radiative recombination and emission region (on the order of 500 nm or smaller) can be appreciably less than the emission wavelength (which can be in a range from 900 nm to 1100 nm). Such a small emission region can provide improved spatial coherence of light output from the LEDs. A small emission size with high spatial coherence can increase coupling efficiency into single-mode waveguides or optical fibers, making the nanowire LED 100 and nanopillar LED 200 useful native emitters for photonic integrated circuits, such as silicon electronic-photonic integrated platforms for optical communication, sensing, and system-on-a-chip based applications.

Figure 3:
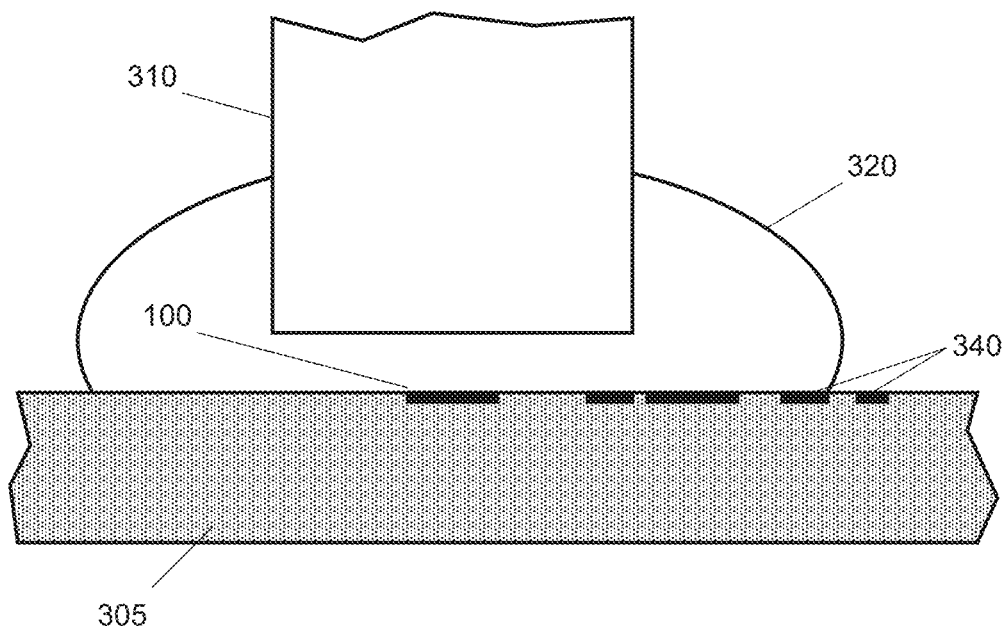
FIG. 3 depicts an optical fiber coupled to a chip on which is formed a nanowire LED.

FIG. 3 depicts an example of a nanowire LED 100 that is butt-coupled to a single-mode optical fiber 310. The fiber 310 can be aligned to the nanowire LED 100 and then adhered once aligned using a UV adhesive 320, for example. Other methods of coupling to waveguides can be used, such as employing a graded refractive index (GRIN) lens or using grating couplers to couple to integrated waveguides on a same chip or separate chip. The nanowire LED 100 can be formed on a chip 305 that can include other electronic and/or photonic integrated circuitry 340.

As a demonstration, nanowire LEDs 100 and nanopillar LEDs 200 were fabricated using a current, non-modified CMOS process. The devices were operated to measure optical outputs and other operating characteristics of the light sources. FIG. 4A depicts an image of optical emission from a nanowire LED 100. For this device, the nanowire 126 had a length L of about 120 nm and a width W of about 55 nm. The thickness is of the semiconductor layer was about 100 nm, and the taper angle θ of the injectors 122, 124 was about 90 degrees. The doping density of the n-type tapered injector was about $1 \times 10^{20}$ cm$^{-3}$ and the doping density of the p-type tapered injector was about $1 \times 10^{20}$ cm$^{-3}$. The gate oxide 100 had a thickness of about 3 nm and the passivating layers comprised a native oxide and nitride layer.

The emission pattern in FIG. 4A was captured using a cooled CMOS camera and a 50×, 0.55 NA microscope objective. The nanowire LED was operated with 1 milliamp (mA) forward bias current and an integration time of 1 second was used to capture the image. The center of the emission spot is saturated on the recorded image but the emission spot indicates that radiative recombination is limited to a sub-micron region in the LED.

To obtain an unsaturated and higher resolution image of the emission region, a 50×, 0.95 NA microscope objective was used with an integration time of 200 milliseconds. The nanowire LED was operated with a forward bias of 1.8 mA. FIG. 4B depicts a measured and fitted beam profile along the x axis and FIG. 4C depicts a measured and fitted beam profile along they axis (see FIG. 1A for x and y directions). A least-square Lorentzian fitting scheme is applied to the image's raw data which indicates the spatial distribution of the emission intensity. The curve-fitting identifies the full-width-half-maximum (FWHM) emission size to be 425 nm along the x-axis and 507 nm along the y-axis, respectively, which is basically diffraction limited according to the numerical aperture of the imaging system (0.95 NA) and the emission spectrum of the nanowire LED (about 900 nm to about 1100 nm).

The slightly larger size along y-axis is due to an apparent extended tail of the emission pattern along this direction. However, this apparent tail is an artifact that is caused by an imperfect alignment between the device plane and the imaging plane rather than reflecting any detailed geometry of the nanowire LED. This was confirmed by rotating the nanowire LED. Therefore, it can be concluded that the radiative recombination region is tightly confined within a diffraction-limited size of approximately 450 nm, which is an upper bound for the actual emission region size in the nanowire LED. Based on these results, the emission region and radiative recombination region is very likely smaller in size and located within the nanowire.

FIG. 5 plots spectral emission from the nanowire LED for forward bias currents of 1 mA, 2 mA, 3 mA, and 4 mA. The total emission increases with increasing forward bias current. The spectral emission is broad, extending from as low as 700 nm to about 1100 nm. The peak emission shifts to shorter wavelengths as current is increased. To obtain the data of FIG. 5, BEOL layers 117 were etched away above the nanowire LED to mitigate multilayer optical interference effects.

Emission power was measured from the nanowire LED using a 50× 0.95 NA objective lens and InGaAs power head. Shielding was used to block ambient radiation from the power head. The system was calibrated beforehand and measurements were corrected to compensate for optical loss at IR wavelengths for the 0.95 NA objective. Emission power as a function of bias current is superlinear and is plotted in FIG. 6. The plot also shows results from other measurements made in a different setup that used a one-inch diameter, 0.79 NA lens with a focal distance of 15 mm and in a fiber-coupling (0.22 NA) measurement. Because of the LED's small size, the emitted power equates to a flux of over 500 W cm$^{-2}$ from the nanowire 126 (using the nanowire's dimensions of 55 nm by 117 nm). This flux is orders of magnitude higher than flux measured from other indirect bandgap light sources and even exceeds flux from high brightness gallium-nitride LEDs. This result is surprising considering measures were not taken to improve photon extraction from the radiative recombination region.

Similar results were obtained for a nanopillar LED that was fabricated using the non-modified CMOS process. The nanopillar LED had a pillar diameter D of about 700 nm, a length $L_1$ of about 650 nm, a length $L_2$ of about 450 nm, a length $L_3$ of about 650 nm, a length $L_4$ of about 125 nm, and a length $L_5$ of about 125 nm. The height H of the pillar 226 (and thickness of the oxide 107) was about 300 nm. The n-type conductivity region 206 and p-type conductivity region 208 had a depth $t_d$ of about 700 nm extending beyond a bottom of the pillar 226. The doping density of the n-type conductivity region 206 was about 1×10$^{17}$ cm$^{-3}$. The doping density of the p-type conductivity region 208 was about 1×10$^{17}$ cm$^{-3}$. The thickness of the semiconductor layer 120 and injectors 122, 124 was about 100 nm. The doping density of the n-type tapered injector was about 1×10$^{20}$ cm$^{-3}$ and the doping density of the p-type tapered injector was about 1×10$^{20}$ cm$^{-3}$. A same gate oxide 110 and passivating layers 112, 114 as used for the nanowire LED were used to passivate the injectors of the nanopillar LED.

The emission region for another nanopillar LED having a smaller diameter (200 nm) and intrinsic region length (135 nm) was measured using the 50× 0.95NA objective to be 446 nm (FWHM x-direction) by 481 nm (FWHM y-direction). The maximum size of the radiative recombination region was estimated to be less than 500 nm. The spectral emission was similar to that for the nanowire LED, though with the peak emission closer to 1000 nm for all bias currents. The peak emission also exhibited blue shifting with increasing forward bias current.

FIG. 6 also plots the measured power as a function of forward bias current for the larger nanopillar LED. The superlinear behavior of output power is also exhibited by the nanopillar LED. The nanopillar LED has a larger output power at a higher forward bias current but has a larger emission area in its intrinsic region (450 nm by 700 nm) compared to the nanowire LED (55 nm by 117 nm). Because of the larger emission area, the maximum flux is estimated to be over 50 W cm$^{-2}$ which, for comparison, is more than four orders of magnitude higher than the top brightness achievable by emitters in the flat-panel displays used in typical applications (500-1000 nits).

An advantage of the nanopillar LED is that injected carriers can diffuse into the central intrinsic region 207 of the nanopillar 226 for recombination and photon emission, where the carriers are laterally distanced away from interfaces with the oxide 107. Therefore, the contact area of the radiative recombination region to the poor-quality interface between bulk-Si and the oxide 107 is reduced compared to a vertical junction LED, for example. This can reduce the surface recombination velocity of carriers in the radiative recombination region. Because of a quality gate oxide 110 and/or other quality passivating layer formed on the top surface of the nanopillar 226, the SRV can be reduced to a value in a range from approximately or exactly 0.1 cm s$^{-1}$ to approximately or exactly 10 cm s$^{-1}$, suppressing non-radiative recombination.

Without being bound by any particular theory, the inventors have postulated that the superlinear power behavior of the nanowire LED and nanopillar LED relates to high temperatures and competing processes in the radiative recombination regions. A preliminary measurement of the nanowire LED using super-resolution Raman thermography reveals a highly localized hot spot up to 500° C. at the nanowire 126 during continuous-wave operation. At a low device pump current which means low carrier density in the active region, the one-particle non-radiative surface recombination (and also a small contribution by the bulk SRH process) dominate the competition of all carrier recombination processes similar to other conventional nano-emitters. However, for the nanowire LED and nanopillar LED the SRV is greatly suppressed in comparison due to the high-quality surface passivation layers adjacent to the radiative recombination regions in these devices as well as along the injectors 122, 124. In this regime (below 1 mA for the nanowire LED and below 5 mA for the nanopillar LED), radiative recombination is weak but not negligible at this nanoscale size. The device's external quantum efficiency (EQE) increases slowly with current. FIG. 7 plots the measured EQE (solid lines) for the two devices and a control device.

As the pump current increases further (above 1 mA for the nanowire LED and above 5 mA for the nanopillar LED), carrier density in the devices' active regions increases to a level such that the Auger recombination process starts to become a more significant recombination process. For most conventional III-V based LEDs, Auger recombination is a three-particle process (proportional to the cubic power of carrier density $n^3$) that keeps the EQE from continuing to increase, causes the efficiency to roll off at a mid to high current density, and causes efficiency droop.

For the nanowire LED and nanopillar LED, the Auger recombination may be dominated by a trap-assisted two-particle process that has a rate proportional to the product of the carrier density squared $n^2$ and the defect density $N_{trap}$ in the active region (which is mainly due to dangling bonds at the material interfaces). During operation, the SRV may saturate the defect states in the radiative recombination region at high carrier density. In this case, the Auger process may de-populate a carrier which has already been captured by a defect state and return the carrier to a high-energy band for a potential radiative recombination before the carrier is nonradiatively recombined with another carrier at the defect site. If this trapped-carrier de-population mechanism of traps has a faster time constant compared to that of the non-radiative surface recombination, the Auger process would no longer be a hurdle to the light generation at high injection current, but rather help suppress the actual dominating negative effect of non-radiative surface recombination and cause a second-stage EQE boost (which can be seen in the graphs of FIG. 7).

Further, a high temperature at the device's radiative recombination region can also contribute to de-populating the traps and/or making more phonons available for radiative recombination, which may become significant depending on the temperature reached in the radiative recombination region. Auger and thermally-assisted carrier de-population of traps may explain the exhibited transition from a slow EQE-increasing regime to a sharp EQE-increasing regime and a superlinear increase in output power for both the nanowire and nanopillar LEDs. As the nanowire LED is much smaller, the transition occurs at a correspondingly lower pump current. Accordingly, instead of output flux falling with the reduction in size of the LED, the output flux increases to levels that can exceed those for direct gap semiconductor LEDs. Such favorable emission characteristics and high intensity may be possible when a maximum size of the radiative recombination region is no larger than 1000 nm and a minimum size of the radiative recombination region is no less than 25 nm. For small sizes, it may not be possible to inject and confine enough carriers efficiently into the radiative recombination region to obtain such high photon flux from the radiative recombination region.

The above-described nanowire and nanopillar LEDs can be formed using a CMOS process, are small in size (e.g., a footprint less than 100 square microns), and have adequate output intensity to communicate over an optical data link having a length from one meter to two kilometers. Shorter or longer optical communication links are also be possible with the light sources described herein. The output power and intensity are sufficient for other free-space applications such as near-field or far-field illumination for microscopy, holography and sensing purposes. Further, the LEDs can be integrated onto a semiconductor chip and can accommodate 30 dB of optical loss for on-board or on-chip communications. Because of their small emission area, the LEDs have an output mode that can efficiently couple to a single-mode optical fiber or waveguide.

The above-described light sources may be implemented in various configurations. Example configurations of light sources are listed below.

(1) A light source comprising: a structure that includes an indirect bandgap semiconductor material formed on a substrate, the structure having a maximum dimension that is no larger than 1000 nm and a minimum dimension that is no smaller than 25 nm and wherein the structure includes a semiconductor junction and a radiative recombination region formed from the indirect bandgap semiconductor material; a first region of n-type semiconductor material connected to the structure and arranged to inject electrons into the radiative recombination region in a first direction; and a second region of p-type semiconductor material connected to the structure and arranged to inject holes into the radiative recombination region in a second direction such that the electrons and the holes recombine in the radiative recombination region to produce photons.

(2) The light source of configuration (1), wherein the light source does not exhibit quantum confinement of the electrons or holes in the structure when operating.

(3) The light source of configuration (1) or (2), adapted to be forward biased when operating and to have an emission area with no transverse dimension larger than 1000 nm and wherein a flux from the emission area is at least 10 W cm$^{-2}$.

(4) The light source of any one of configurations (1) through (3), further comprising: at least one passivation layer adjacent to the structure to suppress non-radiative recombination of the electrons and the holes in the radiative recombination region when the light source is operating.

(5) The light source of configuration (4), wherein a passivation layer of the at least one passivation layer comprises an oxide or a nitride.

(6) The light source of configuration (4), wherein the at least one passivation layer comprises: an oxide layer contacting the radiative recombination region; and a silicon nitride layer contacting the oxide layer.

(7) The light source of any one of configurations (1) through (6), wherein the first region and the second region each taper in width toward the structure.

(8) The light source of any one of configurations (1) through (7), wherein the structure, the first region, and the second region are formed from a same layer of the indirect bandgap semiconductor material.

(9) The light source of any one of configurations (1) through (8), wherein the indirect bandgap semiconductor material is polycrystalline.

(10) The light source of any one of configurations (1) through (8), wherein the indirect bandgap semiconductor material is amorphous.

(11) The light source of any one of configurations (1) through (10), wherein the structure comprises a pillar extending vertically from the substrate.

(12) The light source of any one of configurations (1) through (11), wherein the electrons and the holes are injected into the structure across an oxide barrier when the light source is operating.

(13) The light source of any one of configurations (1) through (12), wherein the indirect bandgap semiconductor material comprises silicon, germanium, an alloy of silicon-germanium, or gallium-phosphide.

(14) The light source of any one of configurations (1) through (13), wherein the semiconductor junction includes an undoped region to form a p-i-n semiconductor junction.

(15) The light source of any one of configurations (1) through (14) in combination with a plurality of the light sources formed on the substrate.

(16) The light source of any one of configurations (1) through (15) in combination with a photonic integrated circuit formed on a same chip.

Example methods of making light sources for the above configurations are listed below.

(17) A method of making a light source, the method comprising: forming a structure from indirect bandgap semiconductor material on a substrate to include a semiconductor junction and a radiative recombination region, wherein the structure has a maximum dimension no larger than 1000 nm and a minimum dimension no smaller than 25 nm; forming a first region of n-type semiconductor material to inject electrons into the radiative recombination region in a first direction; and forming a second region of p-type semiconductor material to inject holes into the radiative recombination region in a second direction such that the electrons and the holes recombine in the radiative recombination region to produce photons.

(18) The method of (17), further comprising: forming at least one passivation layer adjacent to the structure to suppress non-radiative recombination of the electrons and the holes when the light source is operating.

(19) The method of (18), wherein forming at least one passivation layer comprises: depositing an oxide layer in direct contact with the structure; and depositing a silicon nitride layer in direct contact with the oxide layer.

(20) The method of any one of (17) through (19), carried out using an unmodified CMOS process.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The terms "about," "approximately," and "substantially" may be used to refer to a value (such as a target value or values used in numerical ranges), and are intended to encompass the referenced value plus and minus variations that would be considered to be within the scope of the inventive embodiments. The amount of variation could be as much as ±5% in some embodiments, as much as ±10% in some embodiments, and yet as much as ±20% of the listed value(s) in some embodiments. The term "essentially" is used to refer to a value that may vary by no more than ±3%.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A light source comprising:
    a structure comprising indirect bandgap semiconductor material formed on a substrate, the structure having a maximum dimension that is no larger than 1000 nm and a minimum dimension that is no smaller than 25 nm and wherein the structure includes a semiconductor junction and a radiative recombination region formed from the indirect bandgap semiconductor material;
    a first region of n-type semiconductor material connected to the structure and arranged to inject electrons into the radiative recombination region in a first direction; and
    a second region of p-type semiconductor material connected to the structure and arranged to inject holes into the radiative recombination region in a second direction such that the electrons and the holes recombine in the radiative recombination region to produce photons, wherein the electrons and the holes are injected into the structure across an oxide barrier when the light source is operating.

2. The light source of claim 1, wherein the light source does not exhibit quantum confinement of the electrons or holes in the structure when operating.

3. The light source of claim 1, adapted to be forward biased when operating and to have an emission area with no transverse dimension larger than 1000 nm and wherein a flux from the emission area is at least 10 W cm$^{-2}$.

4. The light source of claim 1, further comprising:
at least one passivation layer adjacent to the structure to suppress non-radiative recombination of the electrons and the holes in the radiative recombination region when the light source is operating.

5. The light source of claim 4, wherein a passivation layer of the at least one passivation layer comprises an oxide or a nitride.

6. The light source of claim 4, wherein the at least one passivation layer comprises:
an oxide layer contacting the radiative recombination region; and
a silicon nitride layer contacting the oxide layer.

7. The light source of claim 1, wherein the first region and the second region each taper in width toward the structure.

8. The light source of claim 1, wherein the structure, the first region, and the second region are formed from a same layer of the indirect bandgap semiconductor material.

9. The light source of claim 1, wherein the indirect bandgap semiconductor material is polycrystalline.

10. The light source of claim 1, wherein the indirect bandgap semiconductor material is amorphous.

11. The light source of claim 1, wherein the structure comprises a pillar extending vertically from the substrate.

12. The light source of claim 1, wherein the oxide barrier comprises a gate oxide.

13. The light source of claim 1, wherein the indirect bandgap semiconductor material comprises silicon, germanium, an alloy of silicon-germanium, or gallium-phosphide.

14. The light source of claim 1, wherein the semiconductor junction includes an undoped region to form a p-i-n semiconductor junction.

15. The light source of claim 1 in combination with a plurality of the light sources formed on the substrate.

16. The light source of claim 1 in combination with a photonic integrated circuit formed on a same chip.

17. A method of making a light source, the method comprising:
forming a structure from indirect bandgap semiconductor material on a substrate to include a semiconductor junction and a radiative recombination region, wherein the structure has a maximum dimension no larger than 1000 nm and a minimum dimension no smaller than 25 nm;
forming a first region of n-type semiconductor material to inject electrons into the radiative recombination region in a first direction;
forming an oxide barrier adjacent to the structure; and
forming a second region of p-type semiconductor material to inject holes into the radiative recombination region in a second direction such that the holes are injected into the structure across the oxide barrier and the electrons and the holes recombine in the radiative recombination region to produce photons when the light source is operating.

18. The method of claim 17, further comprising:
forming at least one passivation layer adjacent to the structure to suppress non-radiative recombination of the electrons and the holes when the light source is operating.

19. The method of claim 18, wherein forming at least one passivation layer comprises:
depositing an oxide layer in direct contact with the structure; and
depositing a silicon nitride layer in direct contact with the oxide layer.

20. The method of claim 17, carried out using an unmodified CMOS process.

* * * * *